United States Patent
Singh et al.

(10) Patent No.: US 9,160,317 B2
(45) Date of Patent: Oct. 13, 2015

(54) SEMICONDUCTOR CIRCUIT AND METHOD OF OPERATING THE SAME

(71) Applicants: Rahul Singh, Yongin-si (KR); Min-Su Kim, Hwaseong-si (KR)

(72) Inventors: Rahul Singh, Yongin-si (KR); Min-Su Kim, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 95 days.

(21) Appl. No.: 13/844,242

(22) Filed: Mar. 15, 2013

(65) Prior Publication Data

US 2014/0266364 A1    Sep. 18, 2014

(51) Int. Cl.
*H03K 3/00* (2006.01)
*H03K 3/356* (2006.01)

(52) U.S. Cl.
CPC ................ *H03K 3/356121* (2013.01)

(58) Field of Classification Search
CPC . H03K 3/037; H03K 3/012; H03K 3/356121; H03K 3/0375; H03K 3/356139
USPC ................ 327/200, 201, 218, 208, 210–212; 326/93, 95, 98, 936, 96
See application file for complete search history.

(56) References Cited

U.S. PATENT DOCUMENTS

| | | | |
|---|---|---|---|
| 5,867,049 A * | 2/1999 | Mohd ........................... | 327/200 |
| 5,898,330 A | 4/1999 | Klass | |
| 6,680,638 B2 | 1/2004 | Kim et al. | |
| 6,956,405 B2 * | 10/2005 | Lundberg ..................... | 326/95 |
| 7,495,493 B2 * | 2/2009 | Ramaraju ..................... | 327/211 |
| 7,710,155 B2 * | 5/2010 | Bhatia et al. ................. | 326/93 |
| 7,724,605 B2 | 5/2010 | Kong et al. | |
| 7,777,522 B2 * | 8/2010 | Yang et al. ................... | 326/68 |
| 7,804,346 B2 | 9/2010 | Park | |
| 7,843,243 B2 | 11/2010 | Kim | |
| 8,593,193 B1 * | 11/2013 | Bazes .......................... | 327/202 |
| 2008/0116953 A1 | 5/2008 | Hirata et al. | |
| 2009/0237137 A1 | 9/2009 | Kim | |
| 2010/0176860 A1 | 7/2010 | Chen et al. | |

FOREIGN PATENT DOCUMENTS

| | | |
|---|---|---|
| JP | 2004343570 A | 12/2004 |
| JP | 2008054275 A | 3/2008 |
| KR | 20090100816 A | 9/2009 |

* cited by examiner

*Primary Examiner* — Quan Tra
(74) *Attorney, Agent, or Firm* — Renaissance IP Law Group LLP

(57) ABSTRACT

Provided are a semiconductor circuit and a method of operating the same. The semiconductor circuit includes a first pulse generating circuit enabled to a rising edge of a clock signal and configured to generate a first read pulse, a second pulse generating circuit enabled to a rising edge of the clock signal and configured to generate a second read pulse independent of the first read pulse, a dynamic pull-down stage configured to develop a voltage level of a first dynamic node based at least on data values of an input signal and the first and second read pulses, and a dynamic pull-up stage configured to develop a voltage level of a second dynamic node based at least on data values of the input signal and the first and second read pulses.

18 Claims, 14 Drawing Sheets

1000

SEMICONDUCTOR CIRCUIT AND METHOD OF OPERATING THE SAME

BACKGROUND

1. Field

The present inventive concepts relate to a semiconductor circuit and a method of operating the same, and more particularly, to an improved flip-flop circuit.

2. Description of the Related Art

Electronic semiconductor circuits are used in some fashion or another in virtually all modern day conveniences. Cars, telephones, computers, mobile devices, planes, traffic signals, rocket ships, and even homes incorporate such circuits. Indeed, semiconductor circuits can be found in millions of devices on earth and in space. A flip-flop circuit is an essential and widely used circuit for improving performance of a semiconductor circuit, including for example, microprocessors, which are used in many such devices. The flip-flop circuit stores and sequentially transmits input signals in response to a clock signal or a pulse signal.

Conventional flip-flop circuits have a single dynamic node, which can impede a speed at which an input signal is read by the flip-flop. Moreover, a general master-slave flip-flop goes through six stages for the data value of the input signal to be read and then output. That is to say, in order to output the data value of the input signal after reading the data value, the general master-slave flip-flop goes through six stages, including an inverting stage of a master input terminal, a non-inverting stage, an inverting stage of a master output terminal, an inverting stage of a slave input terminal, a non-inverting stage, and an inverting stage of a slave output terminal.

What is needed is an improved flip-flop circuit having fewer stages. In addition, it would be desirable to have independent dual dynamic nodes controlled by varying pulse widths to increase the overall performance. The inventive concepts disclosed herein address these and other limitations in the prior art.

SUMMARY

Inventive concepts provide a semiconductor circuit, which can operate at a high speed while maintaining reliability in data input/output.

Inventive concepts also provide a system and method of operating a semiconductor circuit, which can operate at a high speed while maintaining reliability in data input/output.

These and other inventive concepts are described in or are apparent from the following description of the preferred embodiments.

According to an inventive aspect, there is provided a semiconductor circuit including a first pulse generating circuit enabled to a rising edge of a clock signal and configured to generate a first read pulse, a second pulse generating circuit enabled to a rising edge of the clock signal and configured to generate a second read pulse independent of the first read pulse, a dynamic pull-down stage configured to develop a voltage level of a first dynamic node based at least on data values of an input signal and the first and second read pulses, and a dynamic pull-up stage configured to develop a voltage level of a second dynamic node based at least on the data values of the input signal and the first and second read pulses.

According to another inventive aspect, there is provided a dynamic stage enabled to a rising edge of a clock signal, and configured to generate first and second read pulses independent of each other, and to develop a voltage level of one of first or second dynamic nodes based at least on data values of an input signal and the generated first and second read pulses; and a push-pull stage configured to read a data value of the input signal by developing a voltage level of a static node based at least on the voltage levels of the input signal and the generated first and second read pulses.

According to still another inventive aspect, there is provided a method of operating a semiconductor circuit, the method including independently generating first and second read pulses enabled to a rising edge of a clock signal, and reading a data value of an input signal by pulling down a first dynamic node or pulling up a second dynamic node based at least on the voltage levels of the input signal and the independently generated first and second read pulses.

According to still another inventive aspect, there is provided a system comprising a processor coupled to a bus, and a memory coupled to the bus and to the processor, wherein at least one of the processor or the memory comprises a semiconductor flip-flop circuit having a first inverting stage, a pulse-based dynamic stage, a push-pull stage, and a second inverting stage.

BRIEF DESCRIPTION OF THE DRAWINGS

The above and other features and advantages of the inventive concepts will become more apparent by describing in detail preferred embodiments thereof with reference to the attached drawings in which.

DETAILED DESCRIPTION

Figure 1:
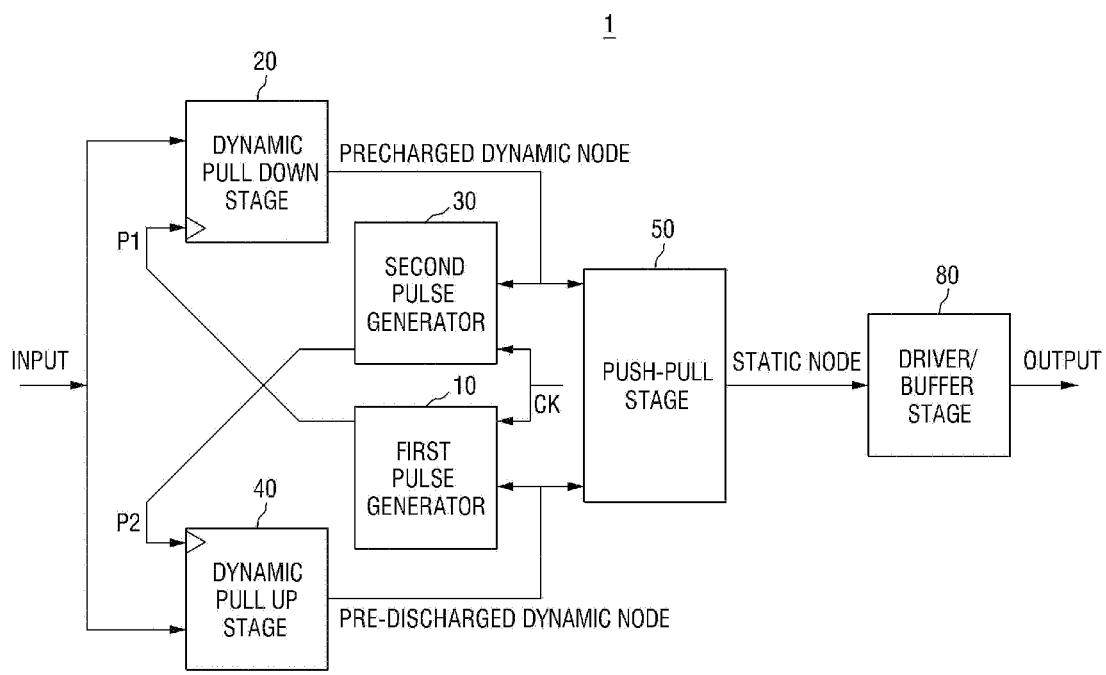
FIG. 1 is a block diagram of a semiconductor circuit according to an inventive concept.

Advantages and features of the present inventive concepts and methods of accomplishing the same may be understood more readily by reference to the following detailed description of preferred embodiments and the accompanying drawings. The inventive concepts may, however, be embodied in many different forms and should not be construed as being limited to the embodiments set forth herein. Rather, these embodiments are provided so that this disclosure will be thorough and complete and will fully convey the inventive concept to those skilled in the art, and the present inventive concepts will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

Unless defined otherwise, all technical and scientific terms used herein have the same meaning as commonly understood by one of ordinary skill in the art to which these inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a semiconductor circuit according to an inventive concept is described with reference to FIGS. 1 and 2.

Figure 2:
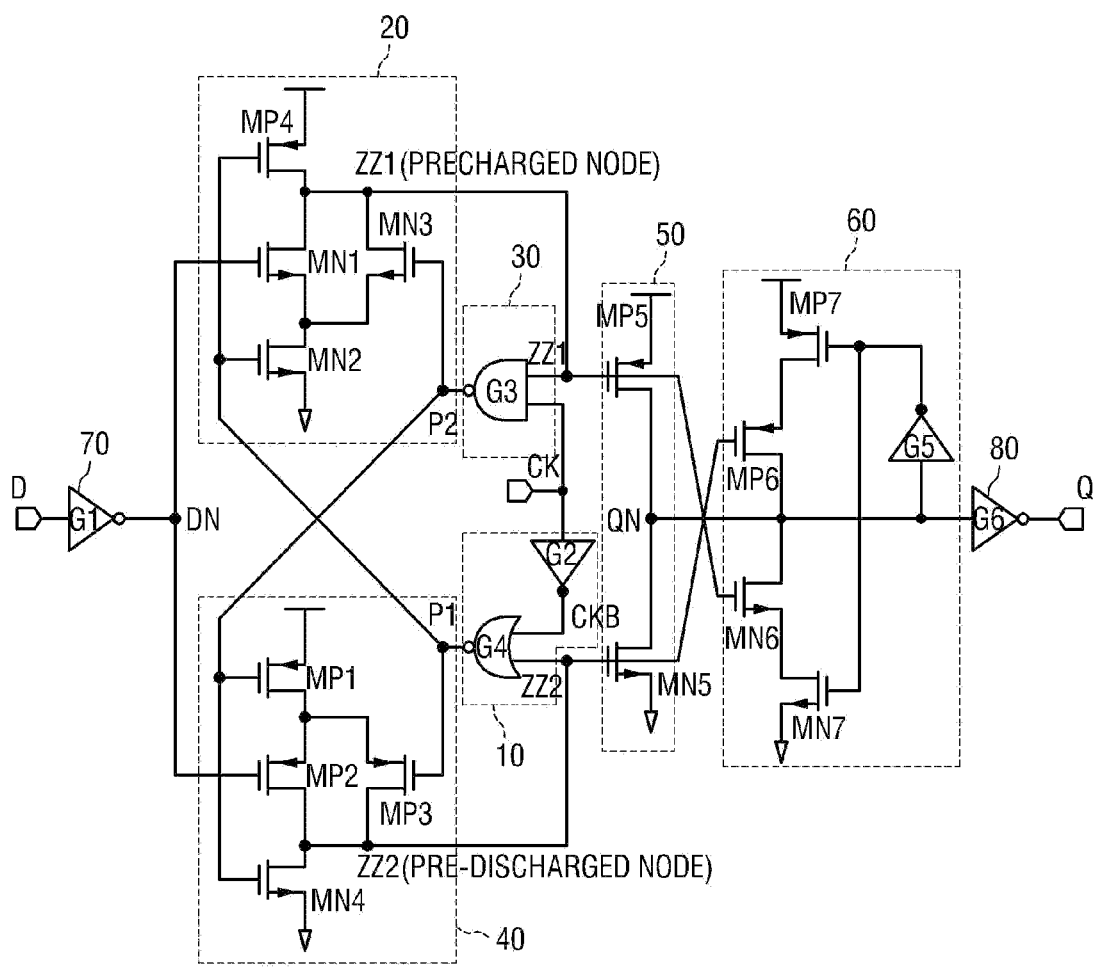
FIG. 2 is a detailed circuit diagram of the semiconductor circuit shown in FIG. 1.

FIG. 1 is a block diagram of a semiconductor circuit according to an inventive concept and FIG. 2 is a detailed circuit diagram of the semiconductor circuit shown in FIG. 1.

In the following description, the semiconductor circuit 1 according to an inventive concept is described with regard to a flip-flop circuit by way of example, but aspects of the present inventive concept are not limited thereto. The inventive concept may also be applied to any modified example of the semiconductor circuit.

Before describing the semiconductor circuit 1 according to an inventive concept, several terms for representing operating characteristics of a flip-flop circuit will first be described.

First, a sampling window Tsw means a time in which an input signal should be maintained for a flip-flop circuit to read a data value of the input signal. The sampling window may be represented in the following equation (1):

$$\text{Sampling Window }(Tsw) = \text{Data Setup Time }(T\text{setup}) + \text{Data Hold Time }(T\text{hold}) \quad (1)$$

Here, the data setup time Tsetup means a time to be provided in advance for the flip-flop circuit to accurately read the data value from the input signal. That is to say, the data setup time Tsetup indicates how much time is required to prepare a read operation before a clock signal is applied in order for the flip-flop circuit to accurately read the data value from the input signal. Meanwhile, the data hold time Thold means a time in which the input signal should be maintained for the flip-flop circuit to accurately read the data value of the input signal. That is to say, the data hold time Thold indicates how much time is required to prepare a read operation before the clock signal is applied in order for the flip-flop circuit to accurately read the data value from the input signal. In general, as the sampling window Tsw is reduced, the flip-flop circuit is capable of operating at a higher speed.

Next, a race margin (R) may be represented in the following equation (2):

$$\text{Race Margin }(R) = \text{Data process Time }(Tcq) - \text{Data Hold Time }(T\text{hold}) \quad (2)$$

Here, the data process time Tcq means a time required for the data value read from the input signal to be output after the clock signal is applied to the flip-flop circuit. That is to say, the data process time Tcq is an index indicating how much time is required for the flip-flop circuit to output data after the clock signal is applied thereto. The data hold time Thold is the same as above, and a repeated explanation is therefore omitted. In general, a larger race margin R means that the flip-flop circuit is capable of operating at a higher speed.

Hereinafter, the semiconductor circuit 1 according to inventive concepts is described in more detail with reference to FIGS. 1 and 2. Since the semiconductor circuit 1 has a relatively large race margin R while maintaining a small sampling window Tsw, it can operate at high speed while maintaining data input/output reliability.

Referring to FIGS. 1 and 2, the semiconductor circuit 1 includes dynamic stages 10, 20, 30 and 40, a push-pull stage 50 and a driver and buffer stage 80.

The dynamic stages 10, 20, 30 and 40 are enabled to a rising edge of a clock signal CK and generate first and second read pulses P1 and P2 independent of each other, and develop a voltage level of one of a first dynamic node ZZ1 and a second dynamic node ZZ2 based at least on a data value of an input signal D using the generated first and second read pulses P1 and P2, thereby reading the data value of the input signal D.

The dynamic stages 10, 20, 30 and 40 may include, for example, a first pulse generating circuit 10, a second pulse generating circuit 30, a dynamic pull-down stage 20, and a dynamic pull-up stage 40.

The first pulse generating circuit 10 may be enabled to the rising edge of the clock signal CK and may generate the first read pulse P1. The first pulse generating circuit 10 may include a second gate G2 and a fourth gate G4.

The second gate G2 may be implemented by, for example, an inverter, and may invert the input clock signal CK to then output an inverted clock signal CKB. The fourth gate G4 may perform an XOR operation on the inverted clock signal CKB and the voltage level of the second dynamic node ZZ2, and then output the first read pulse P1.

The second pulse generating circuit 30 may be enabled to the rising edge of the clock signal CK and may generate the second read pulse P2 independent of the first read pulse P1. The second pulse generating circuit 30 may include a third gate G3. The third gate G3 may perform a NAND operation on the clock signal CK and the voltage level of the first dynamic node ZZ1 to then output the second read pulse P2.

The dynamic pull-down stage 20 may develop the voltage level of the first dynamic node ZZ1 based at least on the data value of the input signal D using the first and second read pulses P1 and P2. More specifically, the dynamic pull-down stage 20 may pull down the voltage level of the first dynamic node ZZ1 based at least on the data value of the input signal D using the first and second read pulses P1 and P2.

The dynamic pull-down stage 20 may include, for example, a fourth PMOS transistor MP4, a first NMOS transistor MN1, a second NMOS transistor MN2, and a third NMOS transistor MN3.

The fourth PMOS transistor MP4 may be gated by the first read pulse P1 to then connect a power terminal and the first dynamic node ZZ1. The fourth PMOS transistor MP4 may serve as a pre-charge transistor that pre-charges the first dynamic node ZZ1 to a first level (i.e., logical high level) before the rising edge of the clock signal CK is applied to the semiconductor circuit 1. The fourth PMOS transistor MP4 may also serve as a keeper transistor that keeps or otherwise maintains the voltage level of the first dynamic node ZZ1 at the first level (i.e., logical high level).

The first NMOS transistor MN1 may be gated by the input signal D to then connect the fourth PMOS transistor MP4 and the second NMOS transistor MN2. In some embodiments, in a case where the semiconductor circuit 1 includes an input buffer circuit 70 shown in FIG. 2, the first NMOS transistor MN1 may be gated by the input signal DN inverted by the input buffer circuit 70 to then connect the fourth PMOS transistor MP4 and the second NMOS transistor MN2.

The second NMOS transistor MN2 may be gated by the first read pulse P1 to then connect the first NMOS transistor MN1 and a ground terminal. The second NMOS transistor MN2 may serve as a pull-down transistor that pulls down the voltage level of the first dynamic node ZZ1 under certain conditions.

The third NMOS transistor MN3 may be gated by the second read pulse P2 to then connect the first dynamic node ZZ1 and the second NMOS transistor MN2. The third NMOS transistor MN3 may serve as a keeper transistor that keeps or otherwise maintains the voltage level of the first dynamic node ZZ1 at a second level (i.e., logical low level) when the voltage level of the first dynamic node ZZ1 is pulled down to the second level (i.e., logical low level).

The dynamic pull-up stage 40 may develop the voltage level of the second dynamic node ZZ2 based at least on the data value of the input signal D using the first and second read pulses P1 and P2. More specifically, the dynamic pull-up stage 40 may pull up the voltage level of the second dynamic node ZZ2 based at least on the data value of the input signal D using the first and second read pulses P1 and P2.

The dynamic pull-up stage 40 may include, for example, a first PMOS transistor MP1, a second PMOS transistor MP2, a third PMOS transistor MP3, and a fourth NMOS transistor MN4.

The fourth NMOS transistor MN4 may be gated by the second read pulse P2 to then connect the ground terminal and the second dynamic node ZZ2. The fourth NMOS transistor MN4 may serve as a pre-discharge transistor that pre-discharges the second dynamic node ZZ2 to the second level (i.e., logical low level) before the rising edge of the clock signal CK is applied to the semiconductor circuit 1. The fourth NMOS transistor MN4 may also serve as a keeper transistor that keeps or otherwise maintains the voltage level of the second dynamic node ZZ2 at the second level (i.e., logical low level).

The second PMOS transistor MP2 may be gated by the input signal D to then connect the fourth NMOS transistor MN4 and the first PMOS transistor MP1. In some embodiments, in a case where the semiconductor circuit 1 includes the input buffer circuit 70, the second PMOS transistor MP2 may be gated by the input signal DN inverted by the input buffer circuit 70 to then connect the fourth NMOS transistor MN4 and the first PMOS transistor MP1.

The first PMOS transistor MP1 may be gated by the second read pulse P2 to then connect the second PMOS transistor MP2 and the power terminal. The first PMOS transistor MP1 may serve as a pull-up transistor that pulls up the voltage level of the second dynamic node ZZ2 under certain conditions.

The third PMOS transistor MP3 may be gated by the first read pulse P1 to then connect the second dynamic node ZZ2 and the first PMOS transistor MP1. The third PMOS transistor MP3 may serve as a keeper transistor that keeps or otherwise maintains the voltage level of the second dynamic node ZZ2 at the first level (i.e., logical high level) when the voltage level of the second dynamic node ZZ2 is pulled up to the first level (i.e., logical high level).

Meanwhile, in some embodiments, as shown in FIG. 2, the semiconductor circuit 1 may include the input buffer circuit 70 disposed at an input port to which the input signal D is input. Here, the input buffer circuit 70 may be, for example, a gain-adjustable inverter G1.

As described above, in a case where the input buffer circuit 70 is a gain-adjustable inverter G1, it may adjust a slope of the rising edge or falling edge of the input signal D. Therefore, when the input buffer circuit 70 is added to a signal input terminal of the semiconductor circuit 1, the semiconductor circuit 1 may operate at higher speed, which will later be described.

The push-pull stage 50 may develop a voltage level of a static node QN based at least on the voltage levels of the first and second dynamic nodes ZZ1 and ZZ2. More specifically, for example, when the voltage levels of the first and second dynamic nodes ZZ1 and ZZ2 are the first level (i.e., logical high level), the push-pull stage 50 may pull down the voltage level of the static node QN to the second level (i.e., logical low level). When the voltage levels of the first and second dynamic nodes ZZ1 and ZZ2 are the second level (i.e., logical low level), the push-pull stage 50 may pull up the voltage level of the static node QN to the first level (i.e., logical high level).

The push-pull stage 50 may include a fifth PMOS transistor MP5 gated by the voltage level of the first dynamic node ZZ1 to connect the power terminal and the static node QN, and a NMOS transistor MN5 gated by the voltage level of the second dynamic node ZZ2 to connect the ground terminal and the static node QN. Here, the fifth PMOS transistor MP5 may be gated by the voltage level of the first dynamic node ZZ1 and may pull up the voltage level of the static node QN, and the fifth NMOS transistor MN5 may be gated by the voltage level of the second dynamic node ZZ2 and may pull down the voltage level of the static node QN.

Meanwhile, the push-pull stage 50 may interface the first and second dynamic nodes ZZ1 and ZZ2 with the static node QN.

In some embodiments, as shown in FIG. 2, the semiconductor circuit 1 may further include a keeper stage 60 connected between the push-pull stage 50 and the driver and buffer stage 80. The keeper stage 60 may keep or otherwise maintain the voltage level of the static node QN. The keeper stage 60 may include a sixth PMOS transistor MP6, a sixth NMOS transistor MN6, a seventh PMOS transistor MP7, a seventh NMOS transistor MN7, and a fifth gate G5.

The sixth PMOS transistor MP6 may be gated by the voltage level of the second dynamic node ZZ2 to then connect the seventh PMOS transistor MP7 and the static node QN. The sixth PMOS transistor MP6 may serve as a keeper transistor that is gated by the voltage level of the second dynamic node ZZ2 and keeps or otherwise maintains the voltage level of the static node QN at the first level (i.e., logical high level).

The sixth NMOS transistor MN6 may be gated by the voltage level of the first dynamic node ZZ1 to then connect the seventh NMOS transistor MN7 and the static node QN. The sixth NMOS transistor MN6 may serve as a keeper transistor that is gated by the voltage level of the first dynamic node ZZ1 and keeps or otherwise maintains the voltage level of the static node QN at the second level (i.e., logical low level).

The seventh PMOS transistor MP7 may be gated by the voltage level of the static node QN inverted by the fifth gate G5 to then connect the power terminal and the sixth PMOS transistor MP6. The seventh PMOS transistor MP7 may be gated by the voltage level of the inverted static node QN and may serve as a pull-up transistor that pulls up the voltage level of the static node QN.

The seventh NMOS transistor MN7 may be gated by the voltage level of the static node QN inverted by the fifth gate G5 to then connect the ground terminal and the sixth NMOS transistor MN6. The seventh NMOS transistor MN7 may be gated by the voltage level of the inverted static node QN and may serve as a pull-down transistor that pulls down the voltage level of the static node QN.

The fifth gate G5 may invert the voltage level of the static node QN. The fifth gate G5 may be implemented by, for example, an inverter.

The driver and buffer stage 80 may be implemented by, for example, an inverter G6, but aspects of the present inventive concepts are not limited thereto. The buffer stage 80 outputs the output signal Q.

Hereinafter, the operation of the semiconductor circuit according to an inventive concept is described with reference to FIGS. 3 and 4.

Figure 3:
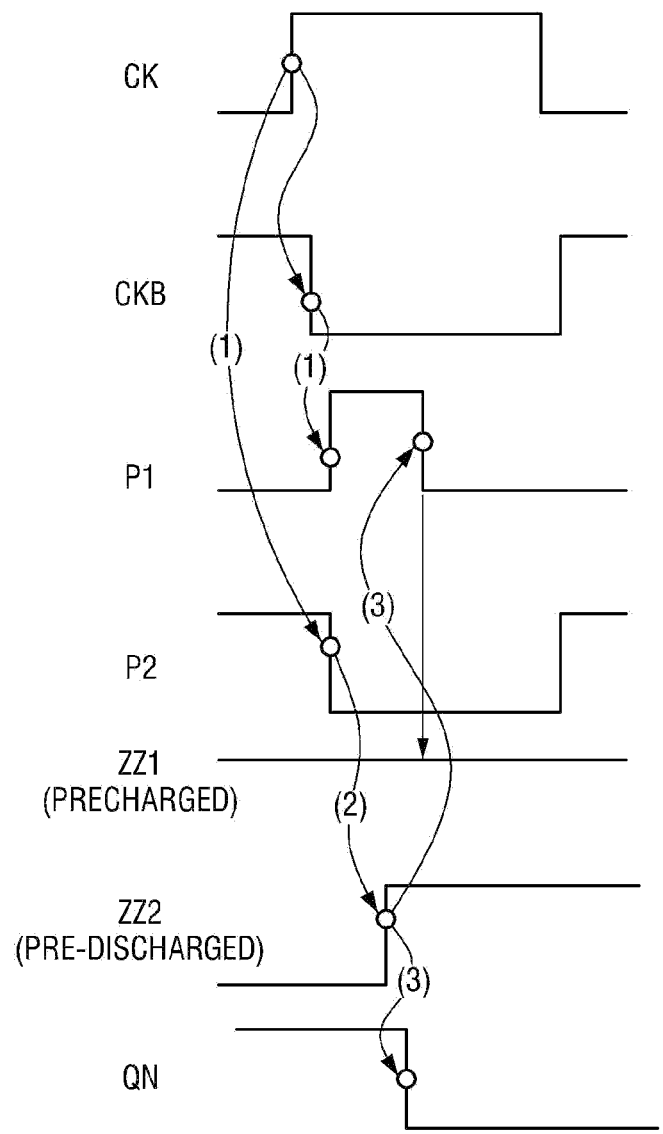
FIGS. 3 and 4 are timing diagrams illustrating operations of the semiconductor circuit shown in FIG. 1.
Figure 4:
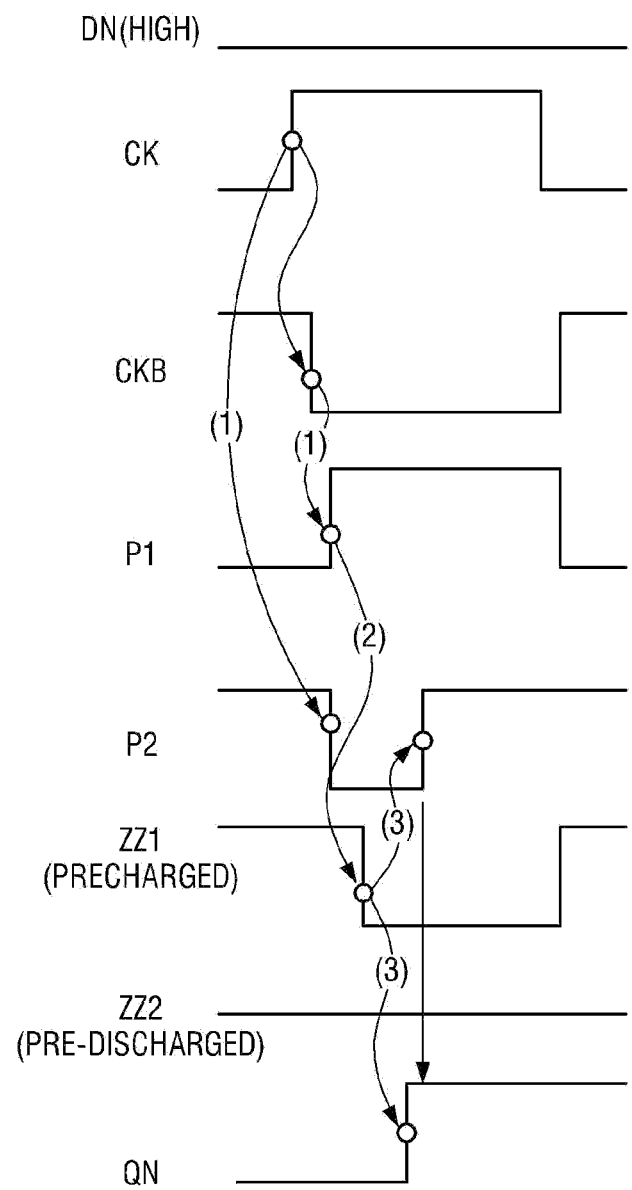

FIGS. 3 and 4 are timing diagrams illustrating operations of the semiconductor circuit shown in FIGS. 1 and/or 2.

First, the operation of the semiconductor circuit 1 is described with regard to a case in which a data value of the input signal D is a logical 1 (i.e., logical high level). In other words, the operation of the semiconductor circuit 1 will first be described with regard to a case in which a data value of the inverted input signal DN is a logical 0 (i.e., logical low level). Reference is now made to FIGS. 2 and 3.

Before a rising edge of a clock signal CK is applied to the semiconductor circuit 1, the first dynamic node ZZ1 is pre-charged by the fourth PMOS transistor MP4 to have a first level (i.e., logical high level) as its voltage level, and the second dynamic node ZZ2 is pre-discharged by the fourth NMOS transistor MN4 to have a second level (i.e., logical low level) as its voltage level, which will now be described in more detail.

First, since the third gate G3 performs a NAND operation on its input signals, it has the following output according to the logic level of the input signals (0=logical low level, 1=logical high level), as shown in Table 1.

TABLE 1

| Input 1 | Input 2 | Output |
|---------|---------|--------|
| 0 | 0 | 1 |
| 0 | 1 | 1 |
| 1 | 0 | 1 |
| 1 | 1 | 0 |

Next, since the fourth gate G4 performs a NOR operation on its input signals, it has the following output according to the logic level of the input signals (0=logical low level, 1=logical high level), as shown in Table 2.

TABLE 2

| Input 1 | Input 2 | Output |
|---------|---------|--------|
| 0 | 0 | 1 |
| 0 | 1 | 0 |
| 1 | 0 | 0 |
| 1 | 1 | 0 |

Before a rising edge is applied, the voltage level of the clock signal CK is the second level (i.e., logical low level). Thus, an input port of the third gate G3 has a data value of 0. Conversely, an input port of the fourth gate G4 has a data value of 1 due to the clock signal CK being inverted by the second gate G2.

Accordingly, as shown in Tables 1 and 2, in a case where the level of the clock signal CK is the second level (i.e., logical low level), the third gate G3 always has an output data value of 1, and the fourth gate G4 always has an output data value of 0. As described above, when the output data value of the third gate G3 is 1, the fourth NMOS transistor MN4 is turned on, thereby pre-discharging the second dynamic node ZZ2. In addition, when the output data value of the fourth gate G4 is 0, the fourth PMOS transistor MP4 is turned on, thereby pre-charging the first dynamic node ZZ1.

Next, if the rising edge of the clock signal CK is applied to the semiconductor circuit 1, that is, if the level of the clock signal CK is changed to the first level (i.e., logical high level), the inputs of the third gate G3 are (1,1), and a second read pulse P2 having the second level (i.e., logical low level) is generated, as illustrated by the arrow (1) in FIG. 3. The generated second read pulse P2 having the second level (i.e., logical low level) turns on the first PMOS transistor MP1.

Meanwhile, if the level of the clock signal CK is changed to the first level (i.e., logical high level), the voltage level of the inverted clock signal CKB is delayed by one gate (delayed by the second gate G2) to then be changed to the second level (i.e., logical low level), as illustrated by the arrow (1) in FIG. 3. Next, since the inputs of the fourth gate G4 are (0,0), the first read pulse P1 having the first level (i.e., logical high level) is generated, as illustrated by the arrow (1) in FIG. 3. The generated first read pulse P1 having the first level (i.e., logical high level) turns on the second NMOS transistor MN2.

Next, since the inverted input signal DN has a data value of 0, the second PMOS transistor MP2 is turned on, while the first NMOS transistor MN1 is turned off. Therefore, the second dynamic node ZZ2 is pulled up, so that its voltage level is changed into the first level (i.e., logical high level), as illustrated by the arrow (2) in FIG. 3, while the first dynamic node ZZ1 maintains its voltage level at the first level (i.e., logical high level).

If the voltage level of the second dynamic node ZZ2 is changed into the first level (i.e., logical high level), the inputs of the fourth gate G4 become (0, 1), so that the voltage level of the first read pulse P1 is changed into the second level (i.e., logical low level). That is to say, a falling edge is generated at the first read pulse P1, as illustrated by the arrow (3) in FIG. 3. Then, since the voltage level of the second dynamic node ZZ2 is changed into the first level (i.e., logical high level), the voltage level of the static node QN is changed into the second level (i.e., logical low level). That is to say, the data value is read from the input signal D, as illustrated by the arrow (3) in FIG. 3.

Meanwhile, since the voltage level of the first dynamic node ZZ1 is maintained at the first level (i.e., logical high level) as it is, the voltage level of the second read pulse P2 is maintained at the second level (i.e., logical low level) until the falling edge of the clock signal CK occurs.

Since the operations of the keeper stage 60 and the driver and buffer stage 80 will be fully understood by one skilled in the art based on the above-description and the illustrated circuits, detailed descriptions thereof are omitted.

Next, the operation of the semiconductor circuit 1 is described with regard to a case in which a data value of the input signal D is a logical 0 (i.e., logical low level). In other words, the operation of the semiconductor circuit 1 will now be described with regard to a case in which a data value of the inverted input signal DN is a logical 1 (i.e., logical high level). Reference is now made to FIGS. 2 and 4.

In this case, before a rising edge of the clock signal CK is applied to the semiconductor circuit 1, the first dynamic node ZZ1 is pre-charged by the fourth PMOS transistor MP4, so that its voltage level becomes the first level (i.e., logical high level), and the second dynamic node ZZ2 is pre-discharged by the fourth NMOS transistor MN4, so that its voltage level becomes the second level (i.e., logical low level), which has been fully described. Thus, repeated explanations are omitted.

Next, if the rising edge of the clock signal CK is applied to the semiconductor circuit 1, that is, if the voltage level of the clock signal CK is changed into the first level (i.e., logical high level), the inputs of the third gate G3 become (1,1), and the second read pulse P2 having the second level (i.e., logical low level) is generated, as illustrated by the arrow (1) in FIG. 4. The generated second read pulse P2 having the second level (i.e., logical low level) turns on the first PMOS transistor MP1.

Meanwhile, if the voltage level of the clock signal CK is changed into the first level (i.e., logical high level), the voltage level of the inverted clock signal CKB is delayed by one gate (i.e., delayed by the second gate G2) to then be changed to the second level (i.e., logical low level), as illustrated by the arrow (1) in FIG. 4. Next, since the inputs of the fourth gate G4 are (0,0), the first read pulse P1 having the first level (i.e., logical high level) is generated, as illustrated by the arrow (1) in FIG. 4. The generated first read pulse P1 having the first level (i.e., logical high level) turns on the second NMOS transistor MN2.

Next, since the inverted input signal DN has a data value of 1, the second PMOS transistor MP2 is turned off, while the first NMOS transistor MN1 is turned on. Therefore, the first dynamic node ZZ1 is pulled down, so that its voltage level is changed into the second level (i.e., logical low level), as illustrated by the arrow (2) in FIG. 4, while the second dynamic node ZZ2 maintains its voltage level at the second level (i.e., logical low level).

If the voltage level of the first dynamic node ZZ1 is changed into the second level (i.e., logical low level), the inputs of the fourth gate G3 become (1,0), so that the voltage level of the second read pulse P2 is changed into the first level (i.e., logical high level). That is to say, a rising edge is generated at the second read pulse P2, as illustrated by the arrow (3) in FIG. 4. Then, since the voltage level of the first dynamic node ZZ1 is changed into the second level (i.e., logical low level), the voltage level of the static node QN is changed into the first level (i.e., logical high level). In such a manner, the data value is read from the input signal D, as illustrated by the arrow (3) in FIG. 4.

Meanwhile, since the voltage level of the second dynamic node ZZ2 is maintained at the second level (i.e., logical low level) as it is, the voltage level of the first read pulse P1 is maintained at the first level (i.e., logical high level) until the falling edge of the clock signal CK occurs.

As described above, since the following operations of the keeper stage 60 and the driver and buffer stage 80 will also be fully understood by one skilled in the art based on the above-description and the illustrated circuits, detailed descriptions thereof are omitted.

As described above, the semiconductor circuit 1 may operate to read a data value of the input signal D in the following manner. In a case where the input signal D has a data value of 1, as illustrated in FIG. 3, the first read pulse P1 having the first level (i.e., logical high level) and having a relatively small pulse width, and the second read pulse P2 having the second level (i.e., logical low level) and having a relatively large pulse width, are each generated. In addition, the falling edge of the first read pulse P1 is generated. Accordingly, the data value of the input signal D is read.

In addition, the semiconductor circuit 1 may operate to read a data value of the input signal D in the following manner. In a case where the input signal D has a data value of 0, as illustrated in FIG. 4, the second read pulse P2 having the second level (i.e., logical low level) and having a relatively small pulse width, and the first read pulse P1 having the first level (i.e., logical high level) and having a relatively large pulse width, are each generated. In addition, the rising edge of the second read pulse P2 is generated.

In other words, in the semiconductor circuit 1 according to an inventive concept, in order to read a data value of the input signal D, the read pulses P1 and P2 having a smaller pulse width than that of the clock signal CK are used. In such a manner, in a case where the pulse widths of the read pulses P1 and P2 for reading the data value of the input signal D are reduced, a time in which the input signal D should be maintained for the semiconductor circuit 1 to accurately read the data value from the input signal D is reduced, thereby reducing a data hold time Thold.

In such a manner, if the data hold time Thold is reduced, a sampling window Tsw of the semiconductor circuit 1 is reduced, as represented by the equations 1 and 2 set forth above, and the race margin R is increased. In other words, the semiconductor circuit 1 can operate at a higher speed.

In addition, in the semiconductor circuit 1 according to an inventive concept, the first and second dynamic nodes ZZ1 and ZZ2 separated from each other are provided as inputs of the push-pull stage 50.

If a single dynamic node were to be provided as an input of the push-pull stage 50, the fifth NMOS transistor MN5 and the fifth PMOS transistor MP5 included in the push-pull stage 50 would be gated by the voltage level of the single dynamic node. In such a case, a speed at which the data value of the input signal D is read at the static node QN would be determined by the speed of a transistor that is later turned on or off.

In contrast, in the semiconductor circuit 1 according to an inventive concept, the first and second dynamic nodes ZZ1 and ZZ2 separated from each other are provided as inputs of the push-pull stage 50, thereby preventing the speed at which the data value of the input signal D is read at the static node QN from being determined by the speed of a transistor that is later turned on or off. Therefore, the operating speed of the semiconductor circuit 1 can be further increased.

In addition, the semiconductor circuit 1 according to an inventive concept has another characteristic for a high-speed operation, which is described in more detail with reference to FIGS. 5 and 6.

Figure 5:
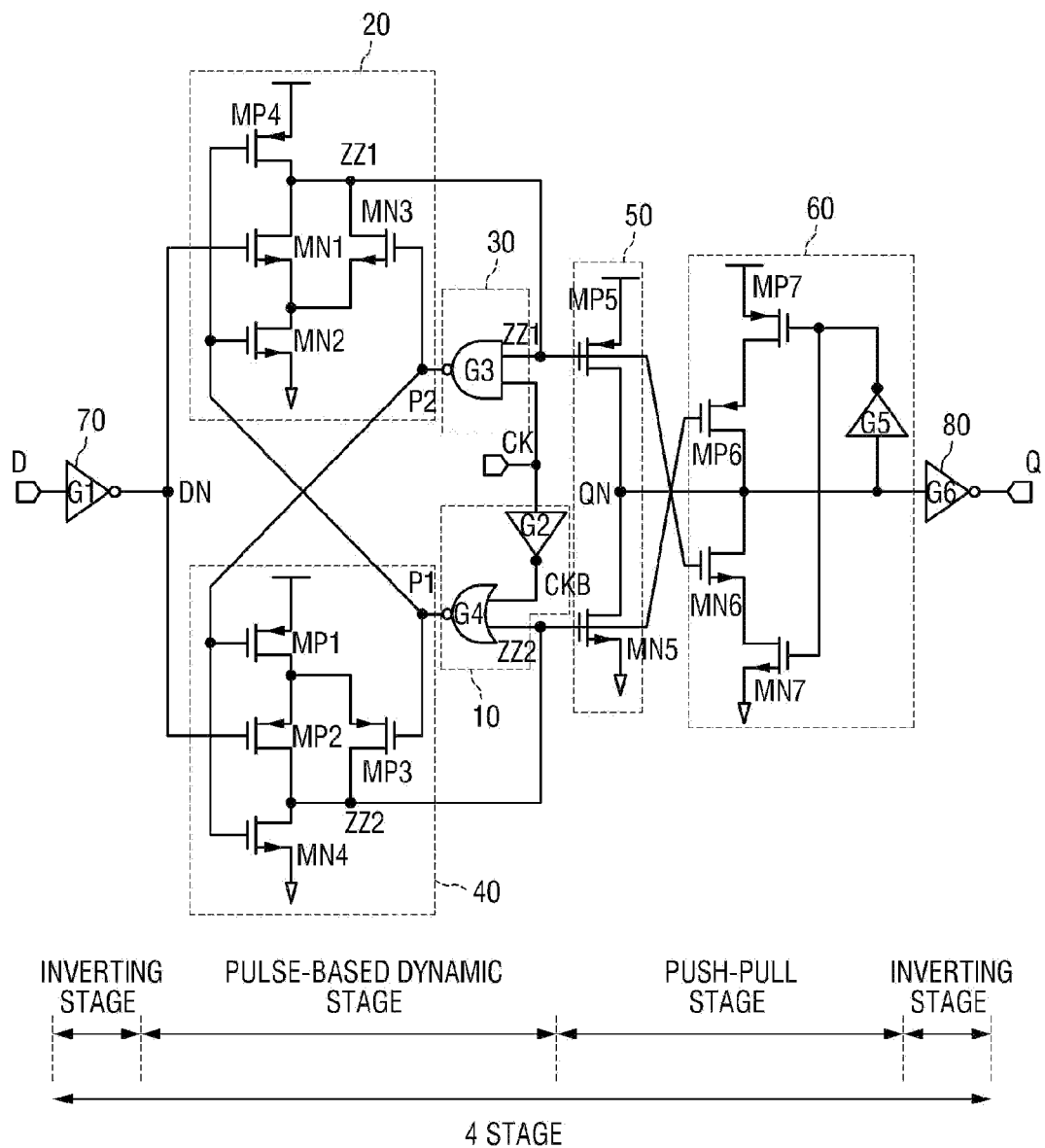
FIGS. 5 and 6 illustrate effects of the semiconductor circuit shown in FIG. 1.
Figure 6:
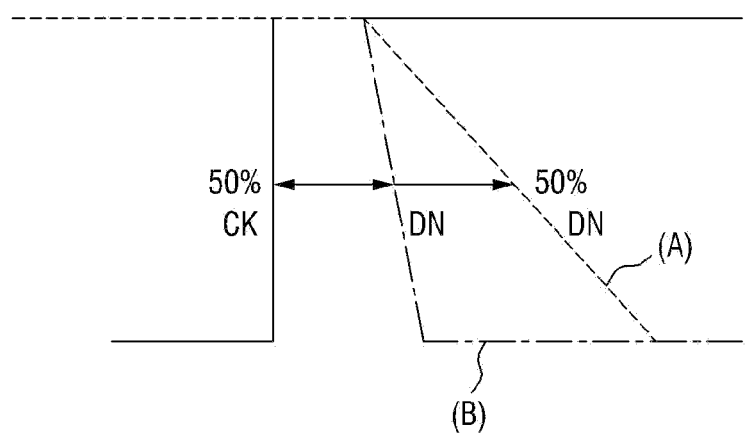

FIGS. 5 and 6 illustrate effects of the semiconductor circuit shown in FIG. 1.

FIG. 5 shows various stages that the semiconductor circuit 1 goes through from the time a data value is read from an input signal D to the time that the data value is output. Referring to FIG. 5, if the semiconductor circuit 1 according to an inventive concept goes through four stages in total, including an inverting stage of an input terminal, a read pulse-based dynamic stage, a push-pull stage, and an inverting stage of an output terminal. In other words, the data value of the input signal D is read and output within four stages.

In the semiconductor circuit 1, the number of stages to go through is smaller than six. That is, the number of stages in which a general master-slave flip-flop goes through until the data value of the input signal D is read and then output is typically six. That is to say, in order to output the data value of the input signal D after reading the data value, the general master-slave flip-flop goes through six stages, including an inverting stage of a master input terminal, a non-inverting stage, an inverting stage of a master output terminal, an inverting stage of a slave input terminal, a non-inverting stage, and an inverting stage of a slave output terminal. Therefore, in comparison, the semiconductor circuit 1 can operate at a higher speed.

Next, referring to FIG. 6, in a case where an inverted input signal DN has a gentle slope, as indicated by the dashed line (A), a data hold time Thold may be increased, compared to a case where the inverted input signal DN has a sharp slope, as indicated by the dashed-dot line (B). This is because a point at which the inverted input signal DN is 50% in the case where the inverted input signal DN has a gentle slope, as indicated by the dashed line (A), is farther from a point at which the clock signal CK is 50% than from a point at which the inverted input signal DN is 50% in the case where the inverted input signal DN has a sharp slope, as indicated by the dashed-dot line (B). In other words, the gentle slope as indicated by the dashed line (A) is farther from the 50% CK than the sharp slope as indicated by the dashed line (B).

Therefore, in the semiconductor circuit 1, since the input buffer circuit 70 is disposed at the input terminal, and a gain of the input buffer circuit 70 can be adjusted, the slope of the inverted input signal DN can be advantageously adjusted, as indicated by (B). That is to say, if the slope of the inverted input signal DN is sharply adjusted, an unnecessary increase in the data hold time Thold can be avoided, thereby improving the operating speed of the semiconductor circuit 1.

Figure 7:
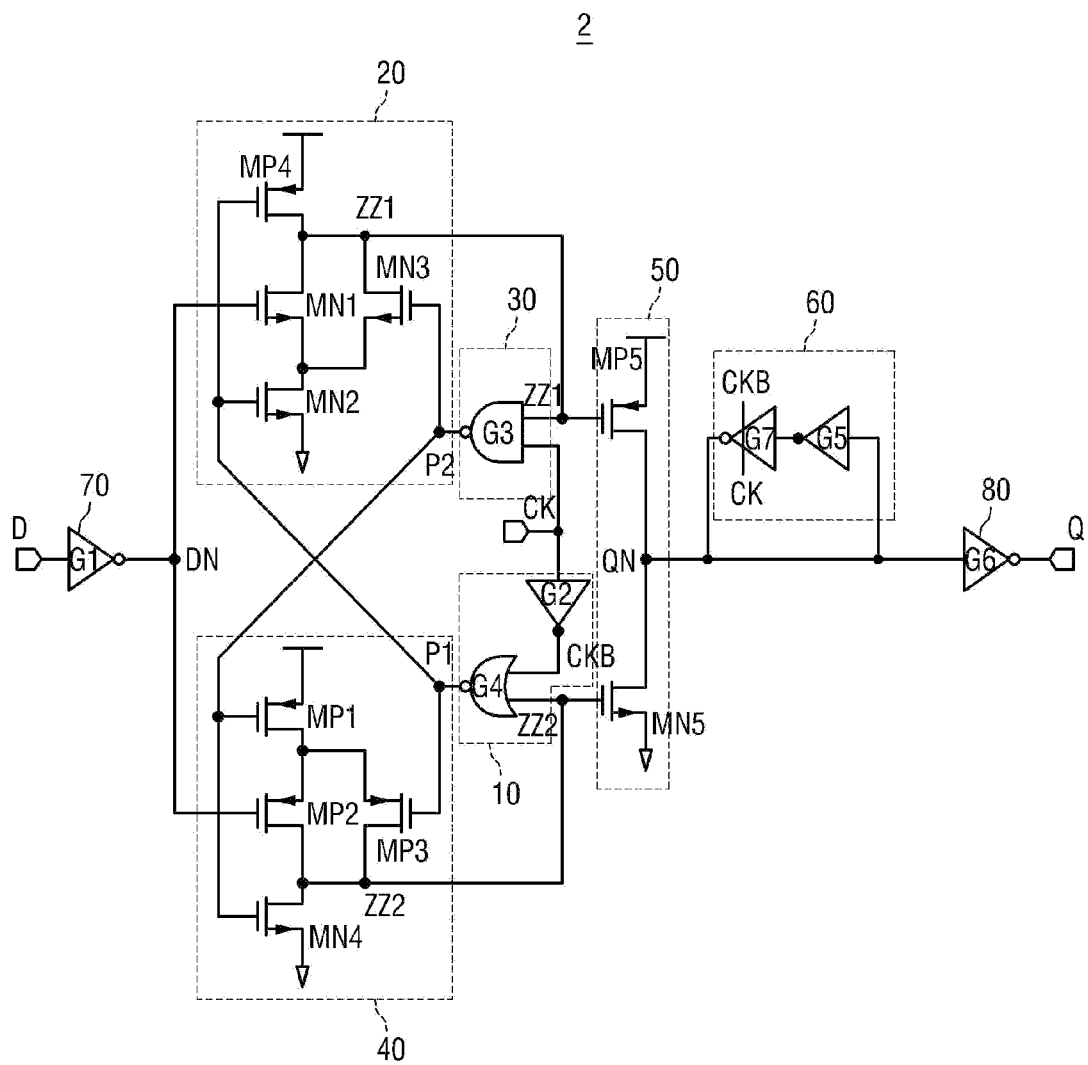
FIG. 7 is a block diagram of a semiconductor circuit according to another inventive concept.

Next, a semiconductor circuit according to another inventive concept is described with reference to FIG. 7. FIG. 7 is a block diagram of a semiconductor circuit according to another inventive concept.

Repeated descriptions of the same components as those of the previous embodiments are omitted, and the following description focuses on differences between the present and previous embodiments.

Referring to FIG. 7, in the semiconductor circuit 2 according to another inventive concept, a keeper stage 60 may include inverters G5 and G7. The inverters G5 and/or G7 may be controlled by a clock signal CK and/or an inverted clock signal CKB. The inverters G5 and G6 may maintain a voltage level of a static node QN. In other words, the keeper stage 60 shown in FIG. 2, including the sixth PMOS transistor MP6, the sixth NMOS transistor MN6, the seventh PMOS transistor MP7, the seventh NMOS transistor MN7, and the fifth gate G5, may be replaced by the simplified keeper stage 60 shown in FIG. 7.

Figure 8:
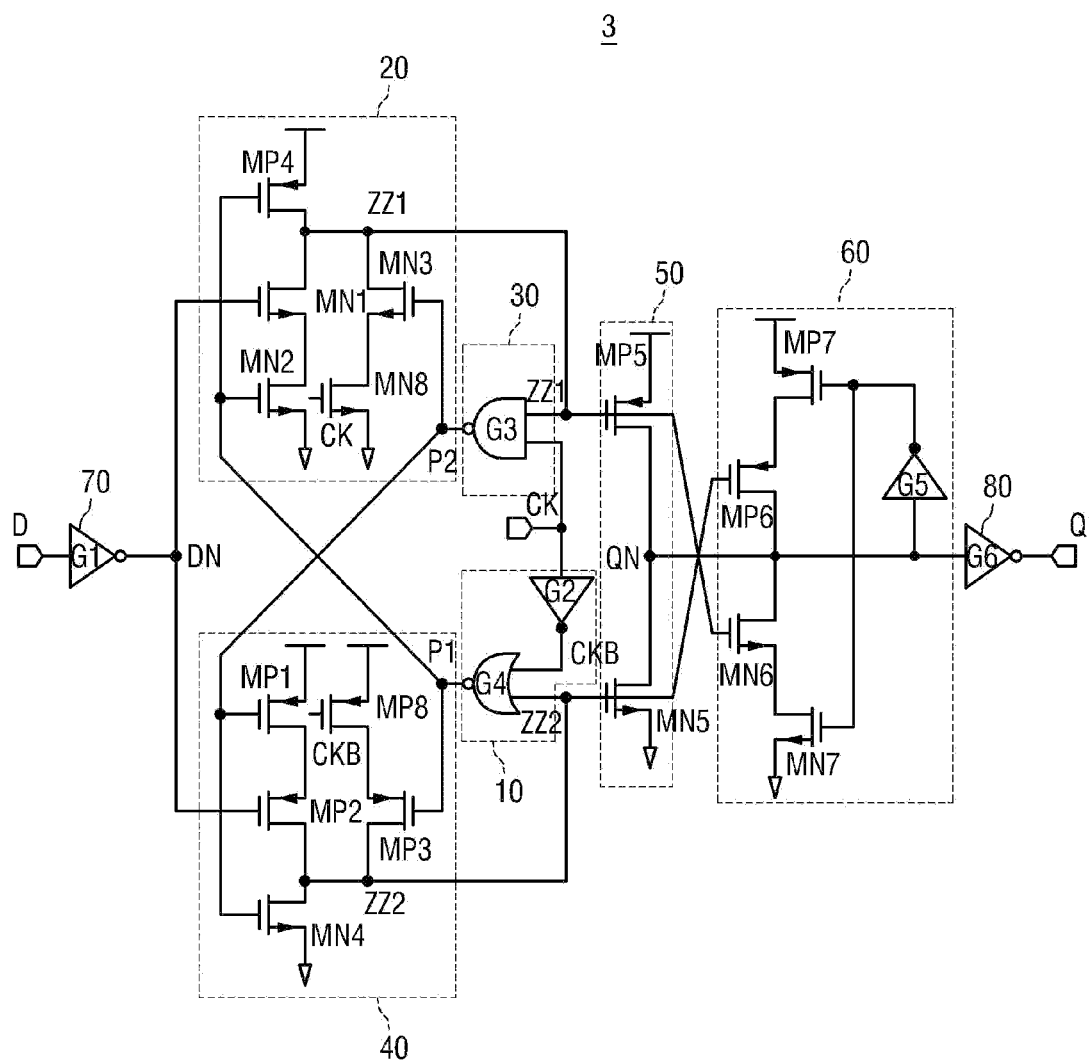
FIG. 8 is a block diagram of a semiconductor circuit according to still another inventive concept.

Next, a semiconductor circuit 3 according to still another inventive concept is described with reference to FIG. 8. FIG. 8 is a block diagram of a semiconductor circuit according to still another inventive concept. Repeated descriptions of the same components as those of the previous embodiments are omitted, and the following description focuses on differences between the present and previous embodiments.

Referring to FIG. 8, in the semiconductor circuit 3 according to still another inventive concept, a dynamic pull-down stage 20 is gated by a clock signal CK, and further includes an eighth NMOS transistor MN8 connecting a third NMOS transistor MN3 and a ground terminal. The clock signal CK is connected to the gate of the eighth NMOS transistor MN8. A dynamic pull-up stage 40 is gated by an inverted clock signal CKB, and further includes an eighth PMOS transistor MP8 connecting a third PMOS transistor MP3 and a power terminal. The inverted clock signal CKB is connected to the gate of the eighth PMOS transistor MP8.

The eighth NMOS transistor MN8 and the third NMOS transistor MN3 included in the dynamic pull-down stage 20 may serve as keeper transistors keeping or otherwise maintaining the voltage level of a first dynamic node ZZ1 at a second level (i.e., logical low level) when the voltage level of the first dynamic node ZZ1 is pulled down to the second level (i.e., logical low level). In addition, the eighth PMOS transistor MP8 and the third PMOS transistor MP3 included in the dynamic pull-up stage 40 may serve as keeper transistors keeping or otherwise maintaining the voltage level of a second dynamic node ZZ2 at a first level (i.e., logical high level) when the voltage level of the second dynamic node ZZ2 is pulled up to the first level (i.e., logical high level).

Figure 9:
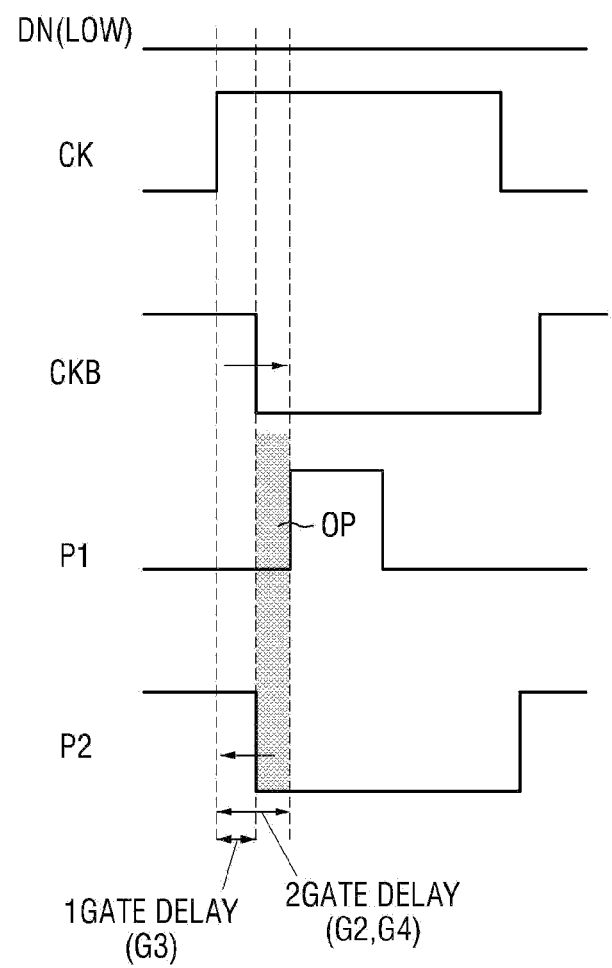
FIGS. 9 to 11 are diagrams illustrating semiconductor circuits according to still another inventive concept.
Figure 10:
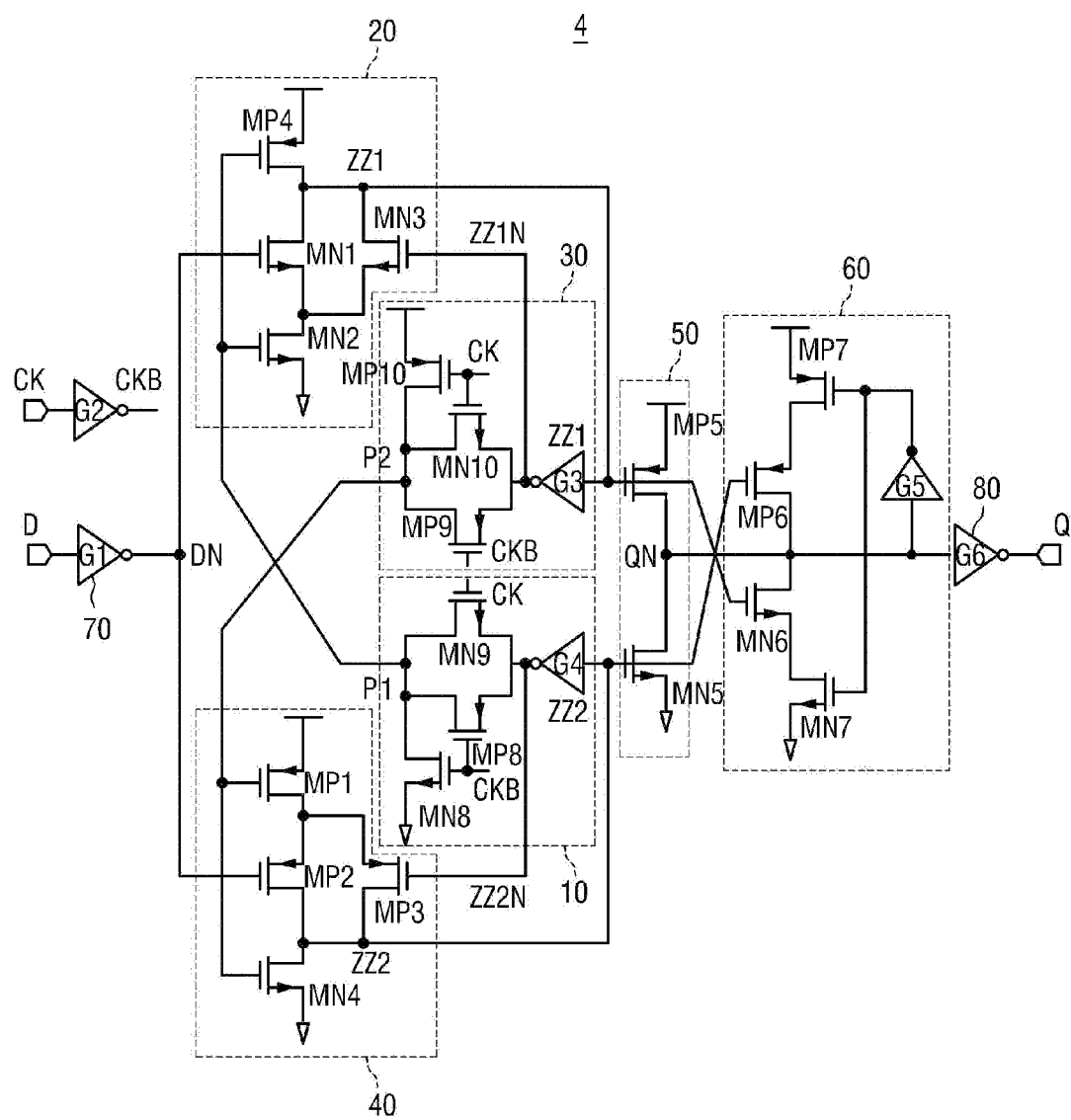
Figure 11:
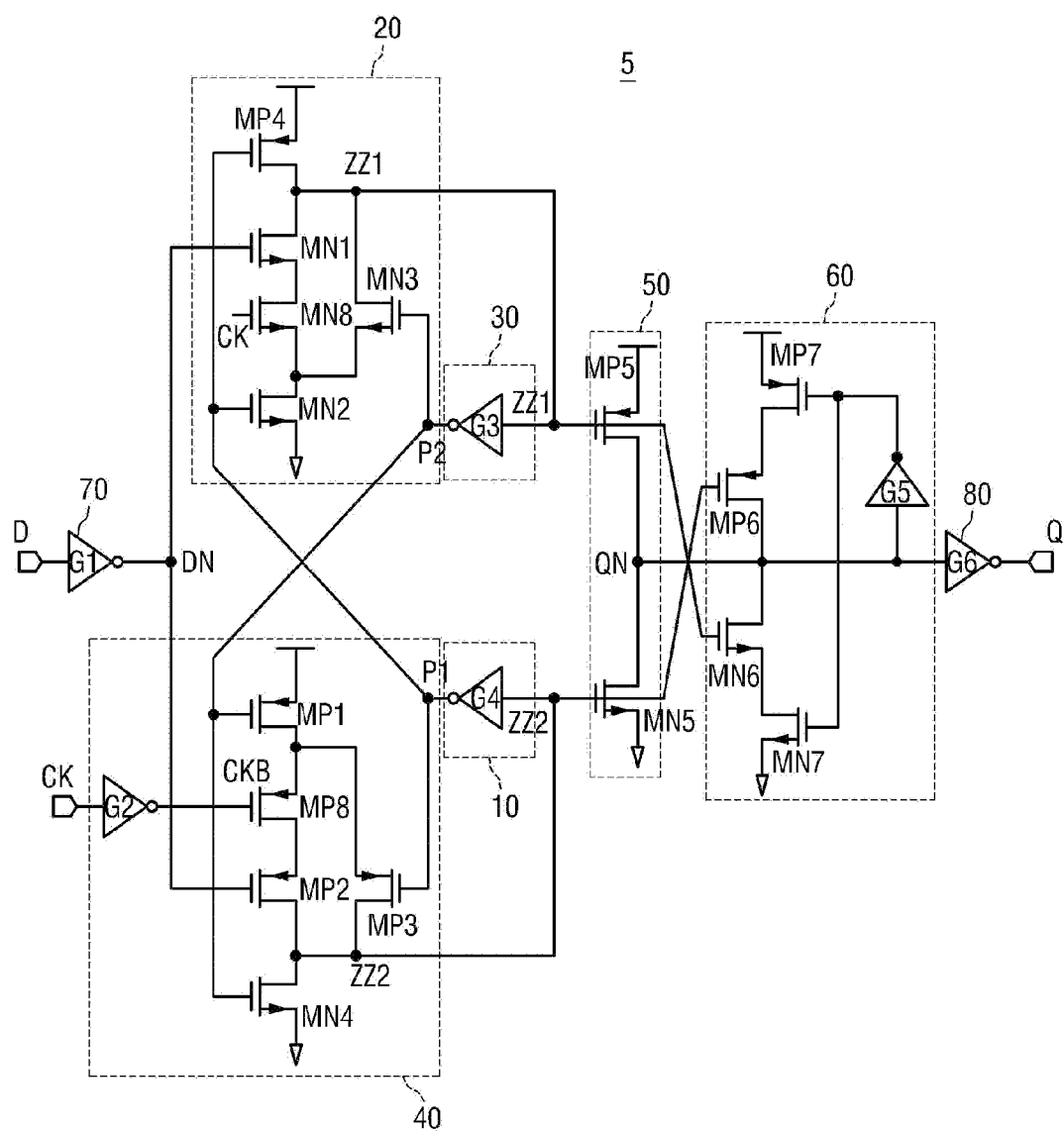

Next, semiconductor circuits according to still another inventive concept are described with reference to FIGS. 9 to 11. FIGS. 9 to 11 are diagrams illustrating semiconductor circuits according to still another inventive concept.

First, referring to FIG. 9, in the above-described embodiments, the second read pulse P2 is generated after the level of the clock signal CK is changed into the first level (i.e., logical high level) and then delayed by one gate (e.g., G3). The first read pulse P1 is generated after the level of the clock signal CK is changed into the first level (i.e., logical high level) and then delayed by two gates (e.g., G2 and G4). Here, since a point of time at which the first read pulse P1 is generated and a point of time at which the second read pulse P2 is generated are uncorrelated, an unwanted operation may occur.

That is to say, when a time taken for a signal to pass the third gate G3, for example, is uncharacteristically long, and a time taken for a signal to pass the second and fourth gates G2 and G4, for example, is uncharacteristically short, an unwanted overlap period (OP) in which the first read pulse P1 has already been generated but the second read pulse P2 has not yet been generated may occur. In other words, the first pulse P1 may be generated sooner than wanted and/or the second read pulse P2 may be generated later than wanted.

Hereinafter, semiconductor circuits 4 and 5 according to still another inventive concept, which can reduce the unwanted overlap period (OP) are described with reference to FIGS. 10 and 11. Repeated descriptions of the same components as those of the previous embodiments are omitted, and the following description focuses on differences between the present and previous embodiments.

First, referring to FIG. 10, unlike the semiconductor circuit 1 according to the previous embodiment, the semiconductor circuit 4 having a third gate G3 and a fourth gate G4 are modified to have an inverter-transmission gate structure.

More specifically, the fourth gate G4 implemented as an XOR gate included in the first pulse generating circuit 10 may be modified to a fourth gate G4 implemented as an inverter, a ninth NMOS transistor MN9 gated by a clock signal CK, an eighth NMOS transistor MN8 gated by an inverted clock signal CKB, and an eighth PMOS transistor MP8 gated by the inverted clock signal CKB. In addition, the third gate G3 implemented as a NAND gate included in the second pulse generating circuit 30 may be modified to a third gate G3 implemented as an inverter, a ninth PMOS transistor MP9 gated by the clock signal CK, a tenth NMOS transistor MN10 gated by the clock signal CK, and a tenth PMOS transistor MP10 gated by the clock signal CK.

The third PMOS transistor MP3 gated by the first read pulse P1 is modified to be gated by a voltage level of an inverted second dynamic node ZZ2N, and the third NMOS transistor MN3 gated by the second read pulse P2 is modified to be gated by a voltage level of an inverted first dynamic node ZZ1N.

In such a modified circuit as described above, even if an area occupied by the circuit is increased more or less as a result of the ninth NMOS transistor MN9 and the ninth PMOS transistor MP9 being further provided, the problem described above with reference to FIG. 9 can be overcome.

Next, referring to FIG. 11, unlike the semiconductor circuit 1 according to the previous embodiment, the semiconductor circuit 5 is modified to have third and fourth gates G3 and G4 both implemented as inverters.

In addition, a dynamic pull-down stage 20 further includes an eighth NMOS transistor MN8 gated by a clock signal CK, and a dynamic pull-up stage 40 further includes an eighth PMOS transistor MP8 gated by an inverted clock signal CKB.

In such a modified circuit as described above, even if a time Tcq taken until data is output after an input signal D is applied is increased more or less as a result of the eighth NMOS transistor MN8 and the eighth PMOS transistor MP8 being further provided as shown in FIG. 11, the problem described above with reference to FIG. 9 can be overcome.

Figure 12:
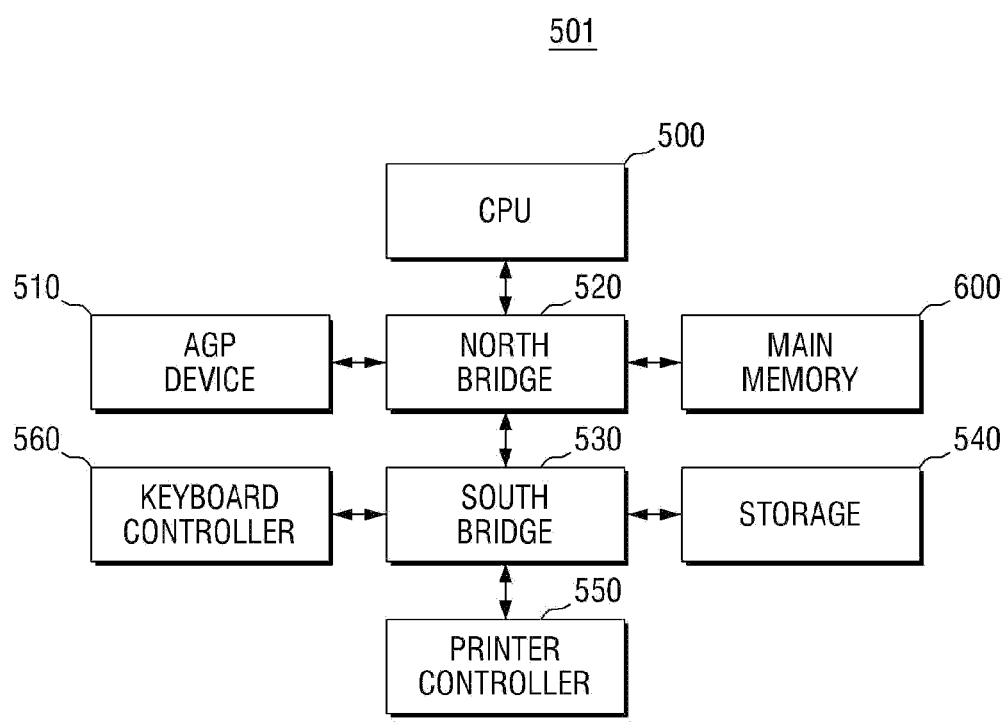
FIG. 12 is a block diagram of a computing system including semiconductor circuits according to inventive concepts.

Next, a computing system to which the semiconductor circuits 1 to 5 according to the above-described embodiments can be employed is described with reference to FIG. 12. FIG. 12 is a block diagram of a computing system including semiconductor circuits according to inventive concepts.

Referring to FIG. 12, the computing system 501 includes a central processing unit 500, an accelerated graphics port (AGP) 510, a main memory 600, a storage (e.g., SSD, HDD, etc.) 540, a north bridge 520, a south bridge 530, a keyboard controller 560, and a printer controller 550.

The computing system 501 shown in FIG. 12 may be a personal computer (PC), a notebook computer, or the like, but aspects of the present inventive concepts are not limited thereto. The computing system 501 may be modified in various manners.

In the computing system 501, the central processing unit 500, the AGP 510, and the main memory 530 may be connected to the north bridge 520, but aspects of the present inventive concepts are not limited thereto. The north bridge 520 may be modified such that it is incorporated into the central processing unit 500.

The AGP 510 may have bus specifications allowing rapid implementation of three-dimensional graphic representation, and may include a video card for reducing a monitor image.

The central processing unit 500 may perform various operations required for driving the computing system 501 and may execute an OS and application programs. One or more of the semiconductor circuits 1 to 5 may be employed as some components of the central processing unit 500.

The main memory 600 may load and store data required to perform operations of the central processing unit 500 from the storage 540. The storage 540, the keyboard controller 560, the printer controller 550 and various peripheral devices (not shown) may be connected to the south bridge 530.

The storage 540 may be a large-capacity data storage device that stores file data, etc., and may be implemented by, for example, HDD or SSD, but aspects of the present inventive concepts are not limited thereto.

In addition, in the computing system 501, the storage 540 is connected to the south bridge 530, but aspects of the present inventive concepts are not limited thereto. Rather, the storage 540 may be modified such that it is connected to the north bridge 520 or directly connected to the central processing unit 500.

Figure 13:
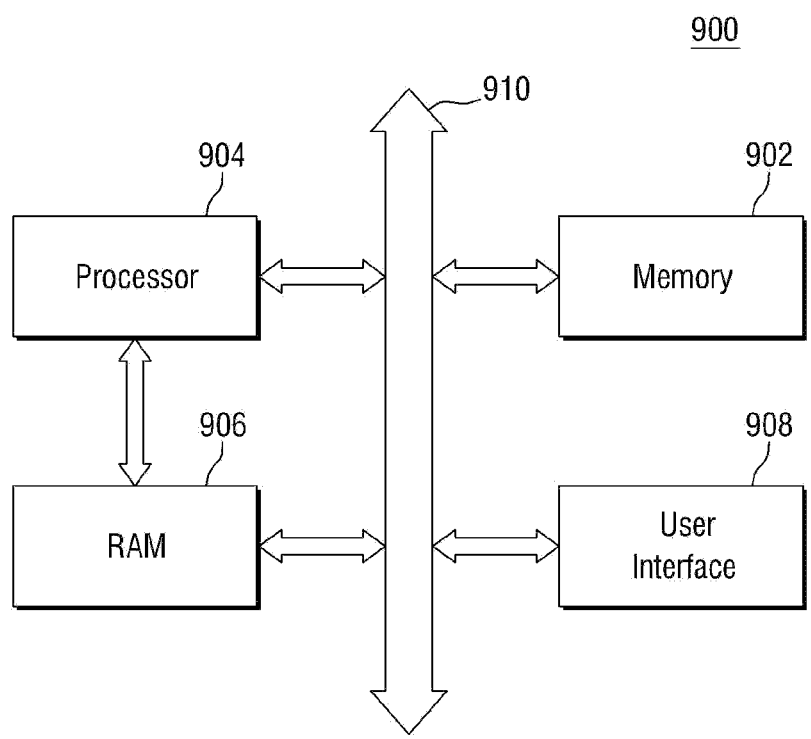
FIG. 13 is a block diagram illustrating a configuration of an electronic system to which the semiconductor devices according to inventive concepts can be applied.

Next, an electronic system to which the semiconductor devices can be applied is described with reference to FIG. 13. FIG. 13 is a block diagram illustrating a configuration of an electronic system to which the semiconductor devices according to the inventive concepts can be applied.

Referring to FIG. 13, the electronic system 900 may include a memory system 902, a processor 904, a random access memory (RAM) 906, and a user interface 908.

The memory system 902, the processor 904, the RAM 906, and the user interface 908 may perform data communication using the bus 910.

The processor 904 may execute a program and may control the electronic system 900. The RAM 906 may be used as an operating memory of the processor 904. Here, the processor 904 may employ at least one of the semiconductor circuits 1 to 5 according to the above-described inventive concepts as one of components thereof. The processor 904 and the RAM 906 may be packaged into a single semiconductor device or a semiconductor package.

The user interface 908 may be used to input or output data to/from the electronic system 900. The memory system 902 may store codes for operating the processor 904 and data processed by the processor 904 or externally input data.

The memory system 902 may include a separate controller for driving the same and may be configured to further include an error correction block. The error correction block may detect an error of data read from the memory system 902 using an error correction code (ECC) and then correct the error. Here, the memory system 902 may employ at least one of the semiconductor circuits 1 to 5 according to the above-described inventive concepts as one of components thereof. Especially address register, data register, and flag register may employ at least one of the semiconductor circuits 1 to 5.

The memory system 902 may be integrated into one semiconductor device. As an example, the memory system 902 may be integrated into one semiconductor device to form a memory card. For example, the memory system 902 may be integrated into one semiconductor device to form a PC card (originally PCMCIA or PCMCIA card), a Compact Flash (CF) card, a Smart Media (SM) Card, a memory stick, Multi Media Card (MMC, RS-MMC, MMCmicro), a Secure Digital card (SD, miniSD, microSD), a Universal Flash storage (UFS), and the like, but not limited thereto.

Figure 14:
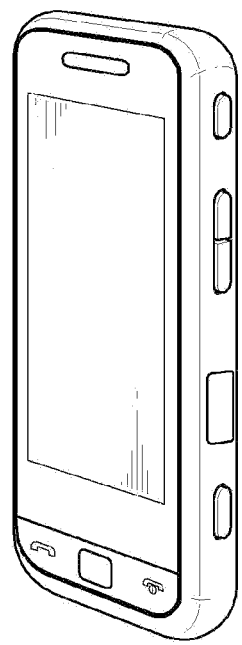
FIG. 14 illustrates an application example of the electronic system shown in FIG. 13 applied to a smart phone.

The electronic system 900 shown in FIG. 13 may be applied to electronic controllers of various electronic devices. FIG. 14 illustrates an application example of the electronic system 900 shown in FIG. 13 applied to a smart phone. In such a case, that is, in a case where the electronic system 900 shown in FIG. 13 is applied to a smart phone 1000, at least one of the semiconductor circuits 1 to 5 according to the inventive concepts may employ some components of an application processor (AP).

In addition, the electronic system (e.g., 900 of FIG. 13) may comprise or be incorporated in a computer, a portable computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems, but not limited thereto.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor circuit comprising:
    a first pulse generating circuit configured to receive a clock signal and a voltage level of a second dynamic node, and to generate a first read pulse;
    a second pulse generating circuit configured to receive the clock signal and a voltage level of a first dynamic node, and to generate a second read pulse;
    a dynamic pull-down stage configured to develop the voltage level of the first dynamic node based on data values of an input signal and the first and second read pulses; and
    a dynamic pull-up stage configured to develop the voltage level of the second dynamic node based on the data values of the input signal and the first and second read pulses.

2. The semiconductor circuit of claim 1, wherein the first read pulse and the second read pulse have different pulse widths.

3. The semiconductor circuit of claim 2, further comprising an input buffer circuit that is configured to invert the input signal, wherein:
    when a data value of the input signal is a first data value, and an inverted data value of the input signal is a second data value, the pulse width of the first read pulse is smaller than that of the second read pulse; and
    when a data value of the input signal is the second data value, and the inverted data value of the input signal is the first data value, the pulse width of the first read pulse is larger than that of the second read pulse.

4. The semiconductor circuit of claim 3, wherein the first data value has a data value of 1, and the second data value has a data value of 0.

5. The semiconductor circuit of claim 1, wherein the first read pulse generated by the first pulse generating circuit has a first level, and the second read pulse generated by the second pulse generating circuit has a second level different from the first level.

6. The semiconductor circuit of claim 5, wherein the first level includes a logical high level and the second level includes a logical low level.

7. The semiconductor circuit of claim 1, wherein one of the first dynamic node and the second dynamic node is pre-charged before a rising edge of the clock signal is generated, and the other is pre-discharged before the rising edge of the clock signal is generated.

8. The semiconductor circuit of claim 7, wherein the first dynamic node is pre-charged before the rising edge of the clock signal is generated, and the second dynamic node is pre-discharged before the rising edge of the clock signal is generated.

9. The semiconductor circuit of claim 1, further comprising an input buffer circuit that is configured to invert the input signal, wherein:
    when a data value of the input signal is a first data value, and an inverted data value of the input signal is a second data value, the dynamic pull-up stage is configured to pull up a voltage level of the second dynamic node; and
    when a data value of the input signal is the second data value, and an inverted data value of the input signal is the first data value, the dynamic pull-down stage is configured to pull down a voltage level of the first dynamic node.

10. The semiconductor circuit of claim 9, wherein the first data value has a data value of 1, and the second data value has a data value of 0.

11. The semiconductor circuit of claim 1, further comprising an input buffer circuit that is configured to adjust a slope of the rising edge or falling edge of the input signal by gain control.

12. The semiconductor circuit of claim 1, further comprising a push-pull stage that is configured to develop a voltage level of a static node based at least on the voltage levels of the first and second dynamic nodes.

13. The semiconductor circuit of claim 12, wherein:
    the push-pull stage includes a first transistor gated by the voltage level of the first dynamic node;
    the first transistor of the push-pull stage is configured to pull up the voltage level of the static node;
    the push-pull stage further includes a second transistor gated by the voltage level of the second dynamic node; and
    the second transistor of the push-pull stage is configured to pull down the voltage level of the static node.

14. The semiconductor circuit of claim 13, wherein the first transistor includes a PMOS transistor and the second transistor includes an NMOS transistor.

15. The semiconductor circuit of claim 12, further comprising a keeper stage that is configured to maintain the voltage level of the static node.

16. The semiconductor circuit of claim 15, wherein:
    the keeper stage includes a first transistor gated by the voltage level of the first dynamic node;
    the first transistor of the keeper stage is configured to maintain the voltage level of the static node;
    the keeper stage further includes a second transistor gated by the voltage level of the second dynamic node; and
    the second transistor of the keeper stage is configured to maintain the voltage level of the static node.

17. The semiconductor circuit of claim 15, wherein the keeper stage includes an inverter configured to be controlled by the clock signal and to maintain the voltage level of the static node.

18. The semiconductor circuit of claim 1, comprising a flip-flop circuit.

* * * * *